United States Patent [19]

Lindstedt et al.

[11] Patent Number: 4,517,529

[45] Date of Patent: May 14, 1985

[54] DIGITAL PHASE/FREQUENCY CONTROL CIRCUIT

[75] Inventors: Guenter Lindstedt, Freiburg; Guido H. Nopper, Umkirch, both of Fed. Rep. of Germany

[73] Assignee: ITT Industries, Inc., New York, N.Y.

[21] Appl. No.: 442,056

[22] Filed: Nov. 16, 1982

[30] Foreign Application Priority Data

Dec. 10, 1981 [EP] European Pat. Off. ........ 81110300.1

[51] Int. Cl.³ .............................................. H03L 7/08
[52] U.S. Cl. ..................................... 331/1 A; 331/17; 331/25; 331/DIG. 2; 307/514; 328/134
[58] Field of Search ................ 307/513, 514; 328/133, 328/134; 331/1 A, 17, DIG. 2

[56] References Cited

U.S. PATENT DOCUMENTS

| | | | |
|---|---|---|---|
| 3,701,039 | 10/1972 | Lang et al. | 331/1 A |
| 3,988,696 | 10/1976 | Sharpe | 328/133 X |
| 4,138,650 | 2/1979 | Anderson | 331/1 A |
| 4,151,473 | 4/1979 | Coleman et al. | 331/1 A X |
| 4,290,029 | 9/1981 | Streckenbach | 331/1 A |

OTHER PUBLICATIONS

Johnson, H. "Detection and Correction of Phase Lock Failure in PLO's," IBM Technical Disclosure Bulletin, v. 14, N. 2, (Jul. 1971), p. 580.

Primary Examiner—Eugene R. LaRoche
Assistant Examiner—W. R. Paxman
Attorney, Agent, or Firm—Donald J. Lenkszus

[57] ABSTRACT

To be able to recover from modes in which the oscillation of the voltage-controlled oscillator (V0) stops, the phase/frequency control circuit includes an RS flip-flop (RS) connected via two AND gates (U3, U3) to the two outputs (A1, A2) of the phase discriminator (P), which provide pulses for raising and lowering, respectively, the frequency of the voltage-controlled oscillator (V0). When the frequency/phase control circuit is out of lock, a pulse is generated with two monostable multivibrators (M1, M2) which passes through a signal selection circuit (S1) associated with the Q output of the RS flip-flop or through a signal selection circuit (S2) associated with the $\overline{Q}$ output of this flip-flop and controls the constant-current source (Q1) charging the smoothing device (G) or the constant-current source (Q2) discharging this device in such a way that the unwanted mode can be stopped by changing the control voltage of the oscillator (V0).

3 Claims, 1 Drawing Figure

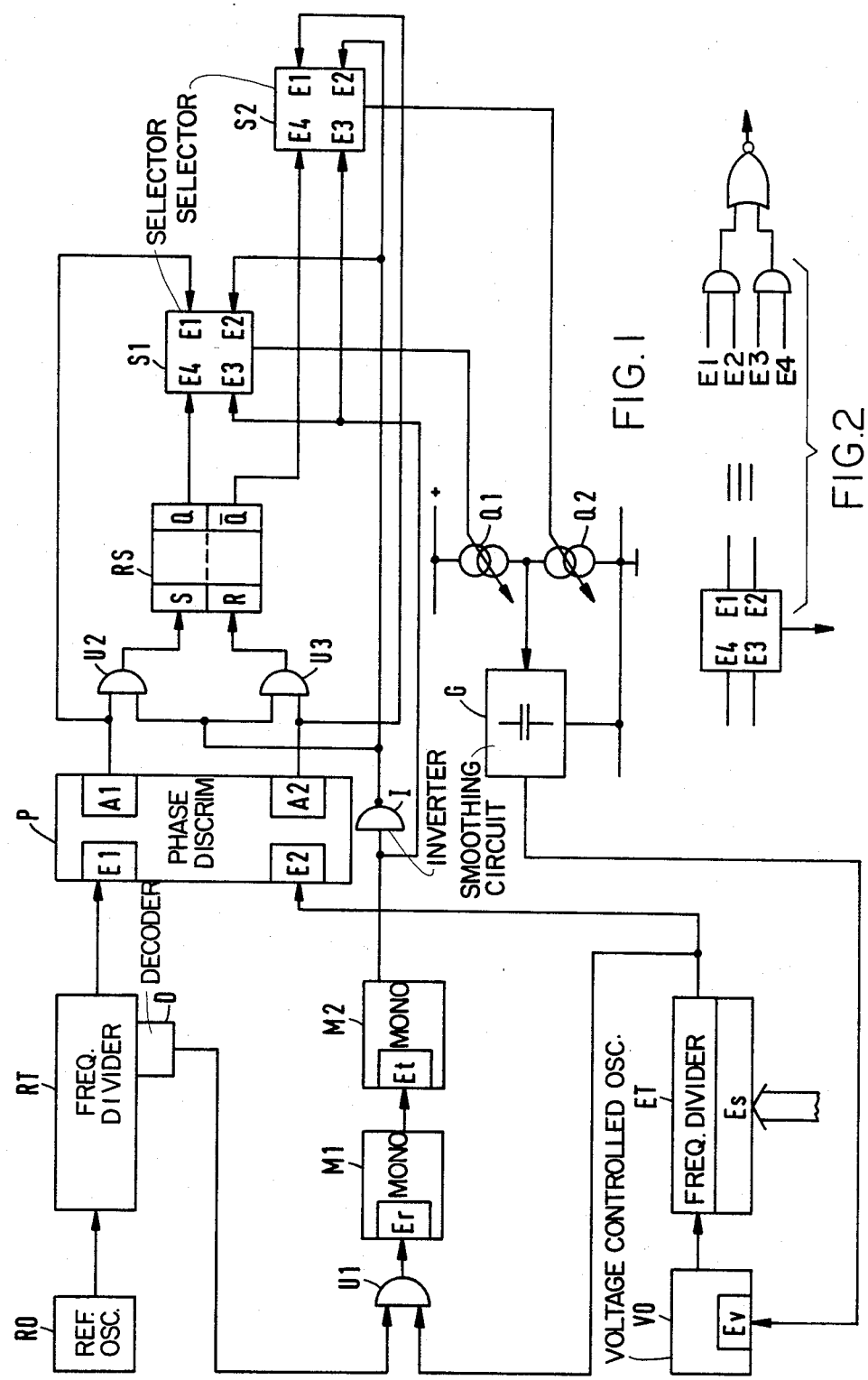

DIGITAL PHASE/FREQUENCY CONTROL CIRCUIT

BACKGROUND OF THE INVENTION

The present invention relates to a digital phase/frequency control circuit wherein the signal of a voltage-controlled oscillator which includes a varactor diode and whose frequency can be varied by a phase discriminator is applied to the first input of the phase discriminator through a presettable frequency divider serving to select the frequency of the oscillator, wherein the signal of a reference oscillator is applied to the second input of the phase discriminator through a reference-frequency divider, and wherein the phase discriminator has a first output for pulses raising the frequency of the oscillator and a second output for pulses lowering the frequency of the oscillator. A phase/frequency control circuit of this kind is disclosed, for example, in U.S. Pat. No. 4,290,029.

Such phase/frequency control circuits as preferably used for station selection in radio and television sets and are also referred to as "PLL systems" or "frequency synthesis systems". If used in radio and television sets, the voltage-controlled oscillator usually includes at least one varactor diode, to which the control voltage is applied to vary the capacitance and, hence, the frequency of the diode. In tuners working on the superhet principle, the voltage-controlled oscillator is the heterodyne oscillator.

In most cases, such arrangements are provided with an electronic search tuning facility, which searches up or down the frequency band until it finds a signal of sufficient strength. Particularly in such search modes, but also when the user switches between widely separated channels of a frequency band, the control voltage may reach the breakdown-voltage region of the varactor diodes. In this region, the varactor diodes, which previously had a high series resistance, rapidly become low-resistance elements and, thus, heavily damp the oscillator, so that oscillator may stop. On the other hand, however, it is also possible that the control voltage becomes so small that the varactor diodes will be driven into their forward-biased regions. Then, too, the oscillator will be heavily damped.

In both cases, the phase/frequency control circuit cannot find its way out of the respective unwanted mode by itself.

SUMMARY OF THE INVENTION

It is an object of the invention to provide a phase/frequency control circuit which ensures that the two modes described can be overcome when they occur.

A phase/frequency control circuit in accordance with the invention includes an RS flip-flop connected via two AND gates to the two outputs of a phase discriminator that provides pulses for raising and lowering the frequency of the voltage controlled oscillator. When the control circuit is out of the locked condition, a pulse is generated with two monostable multivibrators. The pulse passes through a signal selection circuit associated with the Q output of the flip-flop or through a selection circuit associated with the complimentary output of the flip-flop. The pulse controls a constant current source which charges a smoothing element or the constant current source which discharges the smoothing element such that the unwanted mode can be stopped by changing the control voltage of the oscillator.

An embodiment of the invention will now be explained in more detail with reference to the block diagram shown in the figure of the accompanying drawing.

DETAILED DESCRIPTION

The actual phase-frequency control circuit comprises the reference oscillator RO, which will usually be a crystal oscillator because high frequency stability is required, and the reference-frequency divider RT, which is fed with the output signal of the reference oscillator RO and whose output provides a signal divided in frequency by a preset divisor. A given range of successive states of the reference-frequency divider is monitored by means of the decoder D, i.e., if positive logic is used, the output of the decoder will provide the more positive level, H, of the two binary-signal levels H, L when the decoder reaches any of these states being monitored. The phase/frequency control circuit further includes the voltage-controlled oscillator VO, which contains at least one varactor diode, to which the control voltage is applied through the control input Ev, and whoe output signal is applied to the input of the presettable frequency divider ET. The number by which this frequency divider divides can be set by applying a corresponding signal to its set input Es.

The output signal of the reference-frequency divider RT is applied to the first input E1 of the phase discriminator P, and that of the presettable frequency divider ET is applied to the second input E2 of this phase discriminator. The first output A1 of the latter provides pulses for raising the frequency of the oscillator VO, and the second output A2 provided pulses for lowering the frequency of this oscillator. In the locked condition, the two outputs A1, A2 deliver the same number of pulses per unit time. These pulses control the two constant-current sources Q1, Q2 in such a way that the output of the smoothing device G provides a constant DC voltage which determines the frequency of the oscillator VO and, in case of a change in the set signal applied to the presettable frequency divider ET, changes due to the fact that one of the two outputs A1, A2 delivers more pulses per unit than the other.

To attain the object of the invention, subcircuits are provided which do not become active until it is found after a selectable waiting time that the phase/frequency control circuit is no longer in lock. These subcircuits are the above-mentioned decoder D, the first AND gate U1, the resettable first digital monostable multivibrator M1, the second digital monostable multivibrator M2, and the inverter I. Further subcircuits are provided which store information as to which of the two outputs A1, A2 of the phase discriminator B was predominantly active last, i.e., whether the tuning voltage is currently in the vicinity of the breakdown voltage or the forward voltage of the varactor diode. These subcircuits are the RS flip-flop RS with the second and third AND gates U2, U3, and the first and second separation circuits S1, S2.

The output signal of the presettable frequency divider ET and the output signal of the decoder D are ANDed by the first AND gate U1, i.e., the decoder output and the frequency-divider output are each connected to one input of this AND gate. The output of the AND gate is coupled to the reset input Er of the resettable first monostable multivibrator M1, whose output will thus deliver a pulse only if no reset signal is provided by the first AND gate U1 during the quasistable state of the monostable multivibrator M1. That is not the case when the phase/frequency control circuit is in lock, for all output pulses of the presettable frequency divider ET then lie within a time window formed by the decoder D, and a reset pulse appears at the reset input Er of the first monostable multivibrator M1 before the end of the quasistable state is reached. However, if either of the unwanted modes occurs, out of which the circuit cannot find its way by itself, the pulses from the presettable frequency divider ET will no longer fall within the time window formed by the decoder D, so that a pulse will appear at the output of the first monostable multivibrator M1. This pulse is applied to the trigger input Et of the second monostable multivibrator M2, whose output thus delivers a pulse equal in duration to the quasistable state of the second monostable multivibrator M2. This pulse is applied directly to the third input E3 of the first signal selection circuit S1 and to the third input E3 of the second signal selection circuit S2. The first inputs E1 of these two signal selection circuits are connected to the first output A1 and the second output A2, respectively, of the phase discriminator.

The output of the second monostable multivibrator M2 is also connected through the inverter I to the second inputs E2 of the first and second signal selection circuits S1, S2, whose fourth inputs E4 are connected to the Q output and $\overline{Q}$ output, respectively, of the RS flip-flop RS.

The two monostable multivibrators M1, M2 are advantageously implemented with basic digital circuits, e.g., with a counter. In the case of the resettable first monostable multivibrator M1, such a counter also has a corresponding reset input, so that the above-described function can be performed. The counter is fed with a clock signal to be counted.

A preferred internal configuration of the first and second signal selection circuits is shown in the figure at the lower right. It consists of two AND gates whose inputs are associated with the inputs E1, E2 and E3, E4, respectively, and whose two outputs are combined by means of a NOR gate. In positive logic, this is the simplest way to implement the signal selection circuits S1, S2. If the invention is to be implemented in negative logic, anyone skilled in the art will be able to use other simple basic logic gates to realize the corresponding function.

Because of the inversion of the output signal of the second monostable multivibrator M2 by means of the inverter I, the second and third AND gates U2, U3 pass the output signals of the phase discriminator P during normal operation of the phase/frequency control circuit, so that in this mode, the RS flip-flop RS is always in one of its two possible states depending on the pulses applied to it. When the oscillator VO stops, however, one of the two outputs A1, A2 will provide more pulses, so that the circuit will be kept in this state unless steps are taken to solve the problem underlying the invention. In this mode, those inputs of the second and third AND gates U2, U3 which are connected to the inverter output are at L level, so that the circuit is held in the previous state by means of the RS flip-flop RS because the inputs S, R of the latter can no longer be reached by pulses from the phase discriminator P. The two signal selection circuits S1, S2 cause the output signal of the second monostable multivibrator M2, i.e., a pulse of corresponding duration in uninverted or inverted form, to act on the two constant-current sources Q1, Q2 in such a manner that the control voltage acting on the control input Ev of the oscillator VO brings the oscillator out of the unwanted mode. Thus, if the varactor diode of the oscillator VO was operated close to its breakdown voltage, for example, the output pulse from the second monostable multivibrator M2 causes this voltage, usually about 30 V, to be reduced.

As mentioned above, the simplest way to implement a signal selection circuit of this kind is to use a complex gate consisting of two AND elements and one NOR element, as shown in the figure. In this first signal selection circuit S1, one of the two AND elements ANDs the Q output of the RS flip-flop RS and the output of the second monostable multivibrator M2, while the other ANDs the first output A1 of the phase discriminator P and the output of the inverter I. If neither of the AND conditions is satisfied, the output of the first signal selection circuit S1 is at H level, which causes the first constant-current source Q1 to charge the smoothing device G.

Similarly, in the secong signal selection circuit S2, the $\overline{Q}$ output of the RS flip-flop RS and the output of the second monostable multivibrator M2 are ANDed by one of the two AND elements, while the other ANDs the second output A2 of the phase discriminator P and the output of the inverter I. If neither of the two AND conditions is satisfied, the output of the second signal selection circuit S2 is at H level.

The digital phase/frequency control circuit according to the invention is thus capable of getting out of this unwanted mode by itself even if the oscillation of the oscillator VO stops. The main advantage of the invention thus lies in the solution of the problem. Another advantage is that, since the circuit is built exclusively with digital subcircuits, it can be implemented using insulated-gate field-effect transistor circuitry, i.e., so-called MOS circuitry. As in the prior art arrangement disclosed in the above-mentioned U.S. Patent, the phase discriminator P is preferably a digital phase discriminator as shown there in FIG. 8.

Without departing from the scope of the invention, the individual functions may be realized in part, particularly those of the two monostable multivibrators M1, M2, or wholly by means of a microprocessor or microcomputer.

We claim:

1. A digital phase control circuit wherein the output signal of a voltage-controlled oscillator (VO) which includes a varactor diode and whose frequency can be varied by a phase discriminator (P) is applied to the second input (E2) of the phase discriminator (P) through a presettable frequency divider (ET) serving to select the frequency of the oscillator, wherein the signal of a reference oscillator (RO) is applied to the first input (E1) of the phase discriminator (P) through a reference-frequency divider (RT), and wherein the phase discriminator has a first output (A1) for pulses raising the frequency of the oscillator and a second output (A2) for pulses lowering the frequency of the oscillator (VO), *characterized by the following features:*

A range of successive counts of the reference-frequency divider (RT) is monitored by means of a decoder (D) for forming a time window;

the output of the decoder is coupled to the first input of a first AND gate (U1) having its second input connected to the output of the presettable frequency divider (ET);

the reset input (Er) of a resettable first digital monostable multivibrator (M1) is connected to the output of the first AND gate (U1);

the trigger input (Et) of a second digital monostable multivibrator (M2) is connected to the output of the first monostable multivibrator (M1);

the S and R inputs of an RS flip-flop (RS) are connected to the outputs of a second AND gate (U2) and a third AND gate (U3), respectively, to whose first inputs the output signal of the second monostable multivibrator (M2) is applied through an inverter (I);

the second inputs of the second AND gate (U2) and the third AND gate (U3) are connected to the first output (A1) and the second output (A2), respectively, of the phase discriminator (P);

the first and second outputs of the phase discriminator are coupled to the first inputs (E1) of a first control signal selection circuit (S1) and a second control signal selection circuit (S2), respectively, to whose second inputs (E2) the output signal of the second monostable multivibrator (M2) is applied through the inverter (I), and whose third inputs (E3) are fed with the output signal of the second monostable multivibrator (M2) direct, while their fourth inputs (E4) are connected to the Q output and the $\overline{Q}$ output, respectively, of the RS flip-flop (RS);

the output of the first control signal selection cicuit (S1) is coupled to the control input of a first constant-current source (Q1) whose current charges a smoothing device (G), and the output of the second control signal selection circuit (S2) is coupled to the control input of a second constant-current source (Q2) which discharges the smoothing device, and the output of the smoothing device is coupled to the control input (Ev) of the voltage-controlled oscillator (VO).

2. A phase control circuit as claimed in claim 1, characterized in that each of the control signal selection circuits (S1, S2) consists of a first AND element combining the first input (E1) and the second input (E2) of the control signal selection circuit, a second AND element combining the third input (E3) and the fourth input (E4) of the control signal selection circuit, and a NOR element combining the outputs of the first and second AND elements.

3. A phase/frequency control circuit as claimed in claim 1, characterized by implementation using insulated-gate field-effect transistor technology.

* * * * *